United States Patent [19]

Kamieniecki et al.

[11] Patent Number: 4,873,436
[45] Date of Patent: * Oct. 10, 1989

[54] NONDESTRUCTIVE READOUT OF A LATENT ELECTROSTATIC IMAGE FORMED ON AN INSULATING MATERIAL

[75] Inventors: Emil Kamieniecki; Leszek Reiss, both of Lexington; William C. Goldfarb, Melrose, all of Mass.

[73] Assignee: Optical Diagnostic Systems, Inc., Billerica, Mass.

[*] Notice: The portion of the term of this patent subsequent to May 5, 2004 has been disclaimed.

[21] Appl. No.: 46,562

[22] Filed: May 4, 1987

Related U.S. Application Data

[63] Continuation-in-part of Ser. No. 719,725, Apr. 3, 1985, Pat. No. 4,663,526, which is a continuation-in-part of Ser. No. 686,420, Dec. 26, 1984, abandoned.

[51] Int. Cl.$^4$ .......................... G01T 1/24; H01L 31/00
[52] U.S. Cl. .............................. 250/315.3; 250/327.2; 250/370.01
[58] Field of Search ............. 365/112, 215; 357/30 D, 357/30 R; 378/28; 250/271, 315.3, 327.2, 370 G, 370 R, 484.1, 492.2 R

[56] References Cited

U.S. PATENT DOCUMENTS

| | | | |
|---|---|---|---|
| 3,199,086 | 8/1965 | Kallmann et al. | 430/19 |
| 3,691,376 | 9/1972 | Bauerlien et al. | 250/492.2 |
| 3,859,527 | 1/1975 | Luckey | 250/327.2 |
| 4,176,275 | 11/1979 | Korn et al. | 250/213 R |
| 4,296,478 | 10/1981 | Kiess et al. | 365/112 |
| 4,319,284 | 3/1982 | Kiess et al. | 358/294 |
| 4,404,422 | 9/1983 | Green et al. | 136/255 |
| 4,508,966 | 4/1985 | Oberschmid et al. | 250/327.2 |
| 4,541,017 | 9/1985 | Feigt et al. | 358/295 |
| 4,663,526 | 5/1987 | Kamieniecki | 250/315.3 |

Primary Examiner—Janice A. Howell
Assistant Examiner—Constantine Hannaher
Attorney, Agent, or Firm—Irving M. Kriegsman

[57] ABSTRACT

A method and apparatus are described for the nondestructive readout of a latent electrostatic image formed on a sheet or layer of insulating material. A sheet or layer of semiconductor material is disposed in relatively close proximity to the insulating material. A latent electrostatic image formed on the insulating material (by any known means) causes a surface depletion layer to be produced by induction at the surface of the semiconductor material. The location and distribution of the accumulated charges on the semiconductor material are read out as analog electrical signals corresponding to the AC surface photovoltage induced on the semiconductor material as the semiconductor material is scanned with a low intensity modulated light beam of appropriate wavelength, the magnitude of the analog signals depending on the local charge density. The analog electrical signals so obtained are then digitized, processed and stored and/or displayed.

13 Claims, 17 Drawing Sheets

TO READOUT ELECTRONICS 59

NONDESTRUCTIVE READOUT OF A LATENT ELECTROSTATIC IMAGE FORMED ON AN INSULATING MATERIAL

CROSS-REFERENCE TO RELATED APPLICATIONS

This application is a continuation-in-part of U.S. patent application Ser. No. 719,725 filed in the name of Emil Kamieniecki on Apr. 3, 1985 and assigned to Optical Diagnostic Systems Inc. now issued as U.S. Pat. No. 4,663,526, which application is a continuation-in-part of U.S. patent application Ser. No. 686,420 filed in the name of Emil Kamieniecki on Dec. 26, 1984 now abandoned.

BACKGROUND OF THE INVENTION

The present invention relates generally to an apparatus and method for the nondestructive readout of a latent electrostatic image formed on an insulating material. More particularly, the present invention relates to a method and apparatus for reading out a latent electrostatic image formed on a sheet or layer of insulating material by inducing a surface depletion layer on a sheet or layer of semiconducting material that is conductive in the dark (or a change in an already existing surface depletion layer on the semiconducting material) that is related to the latent electrostatic image and then reading out the accumulated charges in the surface depletion layer so formed on the semiconducting material using the surface photovoltage effect.

The invention is especially useful in reading out a latent electrostatic image formed on an insulator by irradiation with X-rays but is not exclusively limited to an electrostatic image formed by that type of radiation.

References of interest include U.S. Pat. No. 3,199,086 to Kallmann et al; U.S. Pat. No. 3,691,376 to Bauerlien et al; U.S. Pat. No. 3,859,527 to Luckey; U.S. Pat. No. 4,176,275 to Korn et al; U.S. Pat. No. 4,296,478 to Kiess et al; U.S. Pat. No. 4,319,284 to Kiess et al; U.S. Pat. No. 4,404,422 t Green et al and U.S. Pat. No. 4,508,966 to Oberschmid et al.

SUMMARY OF THE INVENTION

A method of reading out a latent electrostatic image formed on or at the surface of a sheet or layer of insulating material according to this invention comprises providing a sheet or layer of semiconducting material that is conductive in the dark, positioning said sheet or layer of semiconducting material in relatively close proximity to the insulating material so as to produce by inducing a surface depletion layer at the surface of the sheet or layer of semiconducting material, or a change in an already existing surface depletion layer at the surface of the semiconducting material, that is related to the latent electrostatic image and then measuring the ac surface photovoltage on the semiconducting material which is produced when the semiconducting material is scanned with an intensity modulated beam of light of appropriate wavelength.

An apparatus for reading out a latent electrostatic image on a sheet or layer of insulating material according to an embodiment of this invention includes a sheet or layer of semiconducting material that is conductive in the dark, a reference electrode, a light source, focusing optics, a scanner and readout electronics.

It is an object of this invention to provide a new and improved method and apparatus for reading out a latent electrostatic image formed on a sheet or layer of insulating material.

It is another object of this invention to provide a method as described above which is nondestructive.

It is a further object of this invention to provide a method and apparatus as described above wherein the latent electrostatic image is read out a analog electrical signals.

It is still a further object of this invention to provide a readout device for use in reading out a latent electrostatic image formed on a sheet or layer of insulating material.

It is yet still another object of this invention to provide a new and improved photoreceptor.

It is another object of this invention to provide a reuseable solid state photoreceptor which is capable of storing a latent X-ray image.

It is still another object of this invention to provide a new and improved reference electrode for use in the apparatus of this invention.

Various features and advantages will appear from the description to follow. In the description, reference is made to the accompanying drawings which form a part thereof and in which is shown by way of illustration specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF PREFERRED EMBODIMENTS

Figure 1:
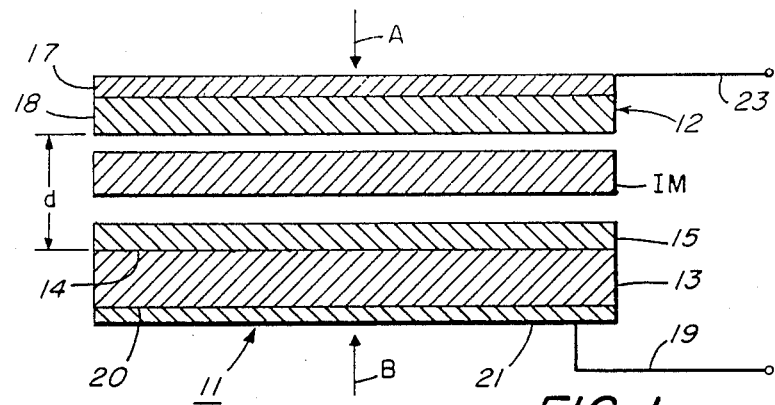
FIG. 1 is cross-sectional view of an insulator on which a latent electrostatic image may be formed and a readout device and reference electrode constructed according to one embodiment of this invention for use in reading out the latent electrostatic image formed on the insulator.

The present invention is directed to an apparatus and method for reading out the location and magnitude (or more exactly surface distribution) of the charges accumulated in a sheet or layer of insulating material.

The apparatus includes (1) a readout device, (2) a reference electrode, (3) a readout illumination system, (4) a scanner and (5) an electronic detection system.

The readout device includes a sheet or layer of semiconductor material that is conductive in the dark. The illumination system may include a light source, focusing optics and a light modulator.

The readout device may be attached to or be separated from the insulating material on which the charge distribution pattern (i.e. accumulated charges) is initially established. The reference electrode may be attached to or be separated from either the readout device or the insulating material.

The semiconductor material may be in the form of either a sheet (wafer) or a layer (film) and may be provided with an electrical contact (referred to hereinafter sometimes as the "pickup electrode") on either its back (i.e. bottom) surface or its side surface. The front (i.e. top) surface of the semiconductor may be left uncovered or, for electrical protection, may be covered with a protective insulating layer. Examples of the semiconducting materials which may be used are crystalline, polycrystalline or amorphous silicon or alloys of silicon. The protective insulating layer may be, for example, silicon oxide or silicon nitride. Positioned some distance from and in front of the front side of the semiconductor is the reference electrode. The semiconductor may be illuminated for readout (i.e. scanned with light from the illumination system from either the front side through the reference electrode or from the back side. In the case of illumination from the front side, both the reference electrode and the protective insulating material must be transparent for the light being used and in the case of illumination from the back side, the back electrical contact and any support or substrate for the semiconductor must be transparent to the light being used. In the case of front illumination, the light of photon energy exceeding the band gap of semiconductor is preferred for reason of high efficiency. In case of illumination from the back, the photon energy should be comparable to the energy gap, so that it will penetrate the semiconductor close enough to the front surface to provide carriers in the depletion layer.

In the case of front illumination, the insulator under measurement should be transparent (or semitransparent) for the light used and the light used must not cause any charge redistribution in this insulator. This is not required in the case of back illumination providing that this illumination does not penetrate into the insulator under measurement.

Sensing of the electrostatic charge accumulated in the insulating material according to the method of this invention requires the presence of a depletion layer in the semiconductor. This can be realized by using a protective insulating layer that is either precharged (by external means) or with an appropriate charge built into it. The charge accumulated in the insulator under measurement will only modify the pre-established depletion layer. The presence of a depletion layer may also be achieved by the use of the semiconductor of the appropriate type of conductivity allowing for formation of the depletion layer due to induced charge. In this case, an n-type semiconductor should be used for sensing negative charge and p-type for sensing positive charge. In any case, the charge build-up in the semiconductor surface (interface) states should be low enough to allow for modification of the depletion layer due to charge induced in the semiconductor.

The output electrical signal produced in reading out the accumulated charges on the semiconductor is generated by the intensity modulated illumination in the charge sensitive part of the readout apparatus i.e. between the semiconductor (or conductive layer in contact with the semiconductor) and the reference electrode. Depending on the requirements, different combination of the scanning mode and modulation can be used. In the case of a raster scan the light may be modulated periodically (for example sinusoidally) or may be not modulated. The unmodulated light will in reality behave like pulse modulation since each area element is illuminated only for a short time.

Referring now to FIG. 1, there is shown an enlarged cross-sectional view of an insulator IM on which a latent electrostatic image (i.e. charge pattern) may be formed (by any known means, not shown), a readout device 11 and a reference electrode 12.

Readout device 11 includes a semiconductor plate 13 which is covered on its top or front surface 14 with a layer 15 of transparent protective insulating material. Semiconductor plate 13 is made of a semiconductor material that is conductive in the dark. The protective insulating layer 15 serves as an electrical protection (blocking contact) against injection of charges from the semiconductor 13 into the body of insulating material IM whose electrostatic charge distribution is to be read out. Reference electrode 12 is disposed above and spaced apart from semiconductor 13. The body of insulating material IM on which the electrostatic charge to be measured is formed is disposed in the space between semiconductor 13 and the reference electrode 12. Reference electrode 12 comprises an optically transparent conductive layer 17 (or a conductive layer divided into sectors (e.g. stripes) on a transparent substrate 18. Alternatively, reference electrode 12 may comprise a conductive wire cloth. Semiconductor 13 which is in the form of a wafer is electrically connected to a lead 19 through an electrical contract 21, which is in the form of a layer, on the back side 20 of semiconductor 13. Another electrical lead 23 is connected to conductive layer 17 of reference electrode 12. Readout device 11 may be illuminated (scanned for readout) from the front (top) through the reference electrode 12 as shown by arrow A or from the back (bottom) as shown by arrow B.

Contact 21 may be in the form of a spot covering only a portion of surface 20 rather than a layer and may be on the side 22 of semiconductor 13 rather than the back of semiconductor 13.

If semiconductor 13 is illuminated from the back (i.e. bottom) as shown by arrow B the substrate on which the semiconductor is formed (if semiconductor 13 is only a layer) must be optically transparent and the electrical contact 21 to the semiconductor should not block the light so that the light can strike the bottom surface of semiconductor 13. The wavelength of the exciting light must be matched to the band gap of the semiconductor 13 in such a way that generation of carriers in the semiconductor 13 occurs sufficiently close to the front (i.e. top), active surface of the semiconductor 13.

For some applications (e.g. with a photoconductive insulator) it should be assured that light does not pass through semiconductor 13, or, if it actually does pass through, that it does not redistribute the charge in the insulator.

Figure 2A:
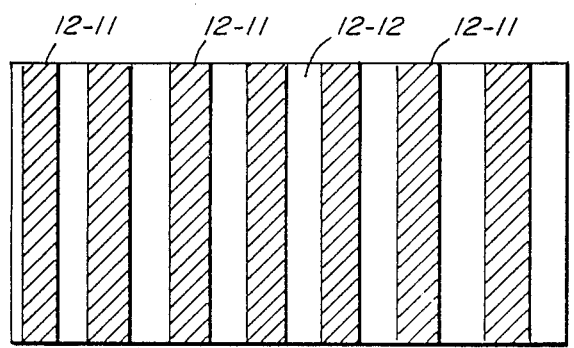
FIG. 2(a) and 2(b) are top views partly broken away of alternate configurations of the reference electrode in the apparatus of the invention.
Figure 2B:
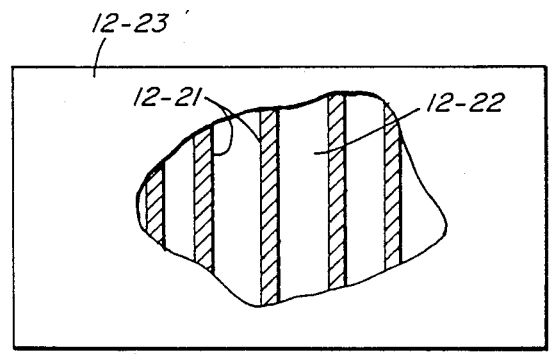

In FIGS. 2(a) and 2(b), there are illustrated some alternate possible configurations of reference electrode 12.

In FIG. 2(a) reference electrode 12-1 comprises a plurality of conductive stripes 12-11 on the top surface of a transparent substrate 12-12 connected to a common conductor line L. The width of the stripes 12-11 is about the same as the diameter of the light beam spot (plus diffussion) where it strikes reference electrode 12-1.

In FIG. 2(b), the reference electrode 12-2 comprises a plurality of conductive stripes 12-21 connected to a common conductive line (not shown), having a width much thinner than the diameter of the light beam spot, sandwiched between a transparent substrate 12-22 and a uniform layer of photoconductive insulating material 12-23. This insulating layer 12-23 becomes conductive in the illuminated area making electrical contact to the respective stripe. If amorphous doped silicon is used as an active semiconductor electrode, the insulating layer 12-23 could be of undoped, high resistivity amorphous silicon.

Figure 3:
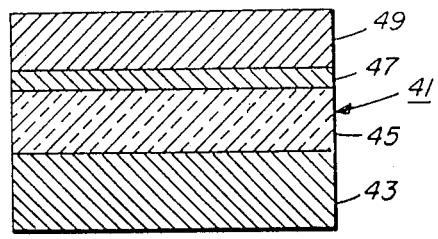
FIG. 3 is a cross sectional view of one embodiment of photoreceptor constructed according to this invention.

Referring now to FIG. 3 there is shown a cross-section view of an embodiment of a photoreceptor 41 constructed according to the teachings of the present invention, the photoreceptor comprising as a single unit a readout device and photoconductive insulator.

Photoreceptor 41 includes a substrate 43 made of conductive material (or a layer of conductive material on a nonconductive substrate). A layer of semiconductive material 45 which is conductive in the dark and which may be in the form of a single crystal (such as silicon), or an amorphous layer (such as Si or Si-Ge alloy) is deposited by any conventional means on the top surface of substrate 43. A protective insulating layer 47 which may be for example, silicon oxide or silicon nitride is deposited over layer 45 and a photoconductive insulating layer 49, such as, for example, selenium or a selenium-alloy is formed over layer 47. Examples of other photoconductive insulating layers which may be used are amorphous or polycrystalline mercuric iodide and lead hallides, such as PbI2.

In using photoreceptor 41, photoconductive insulating layer 49, which is previously charged, (such as by with a corona) is exposed to a pattern of radiation, such as X-ray radiation which forms thereon a latent charge image. The surface depletion layer induced on semiconductor layer 45 by the latent charge image is read out by scanning the semiconductor 45 with a beam of light and measuring the output photovoltage developed across semiconductor 45 and a reference electrode (not shown). Semiconductor 45 may be scanned from either the top or the bottom. If scanned from the top, the scanning light should be of a wavelength that does not interact with photoconductive insulating layer 49. If scanned from the bottom, substrate 43 must be transparent as well as conductive (i.e. either a conductive transparent material or a conductive transparent layer on a transparent substrate).

Figure 4:
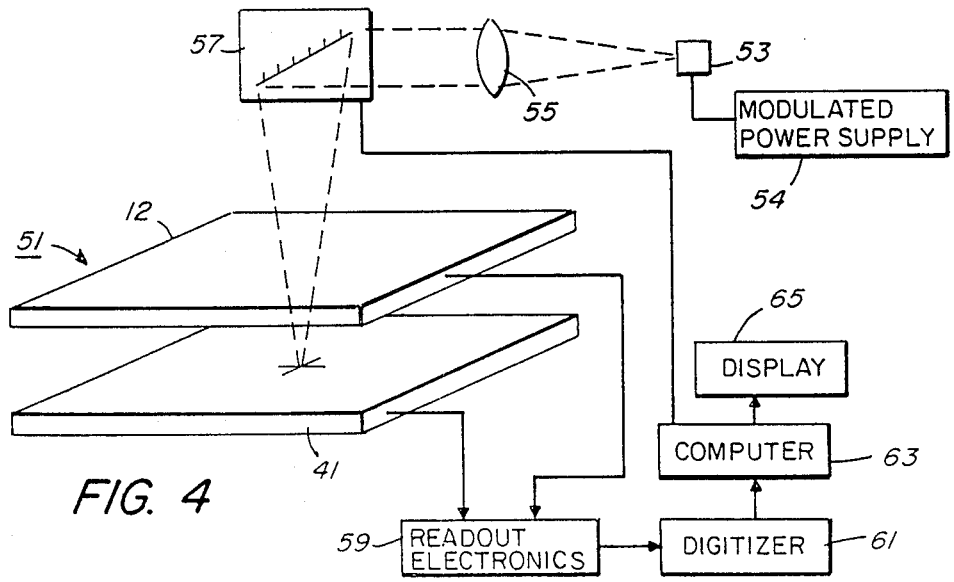
FIG. 4 is a schematic of an embodiment of an apparatus for recording and reading out a latent electrostatic image according to this invention.

Referring now to FIG. 4 there is illustrated an embodiment of an apparatus 51 for practicing the invention using photoreceptor 41.

An intensity modulated beam of light produced by a light source 53 in the form of a diode laser and which is powered by a modulated power supply 54 is focused by a lens 55 through conductive electrode 12 onto the semiconductor layer in photoreceptor 41. Examples of some but not all of the other light sources that may be used are a light emitting diode (LED) a helium-neon (He-Ne) laser or a helium cadmium (He-Cad) laser. If an LED is employed, modulation of the light beam is achieved by using a modulated power supply. If a gas laser is used, modulation of the light beam is achieved using an external light modulator, such as an acousto-optical modulator. Before reaching the semiconductor layer, the intensity modulated light beam is deflected by an x-y scanner 57, which may be an xy optical galvanometer Scanner Model No. XY100PD, manufactured by General Scanning Inc., Watertown, MA. The resulting output photovoltage signal developed across conductive electrode 12 and photoreceptor 41 is amplified by an amplifier in readout 59-1 electronics 59, digitized by a digitizer 61 and then fed into a computer 63 where it may be processed, stored and/or displayed on a monitor 55.

Figure 5:
FIG. 5 is a cross-sectional view of a portion of another embodiment of an apparatus for practicing the invention.
Figure 5:
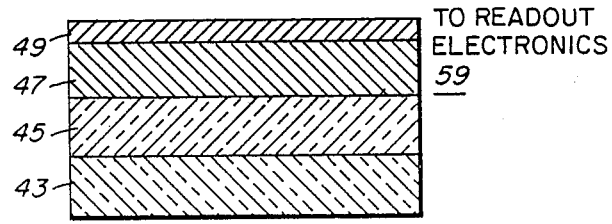

In FIG. 5 there is shown an arrangement wherein the readout light beam scans semiconductor 45 from the back or bottom rather than from the front.

Figure 6:
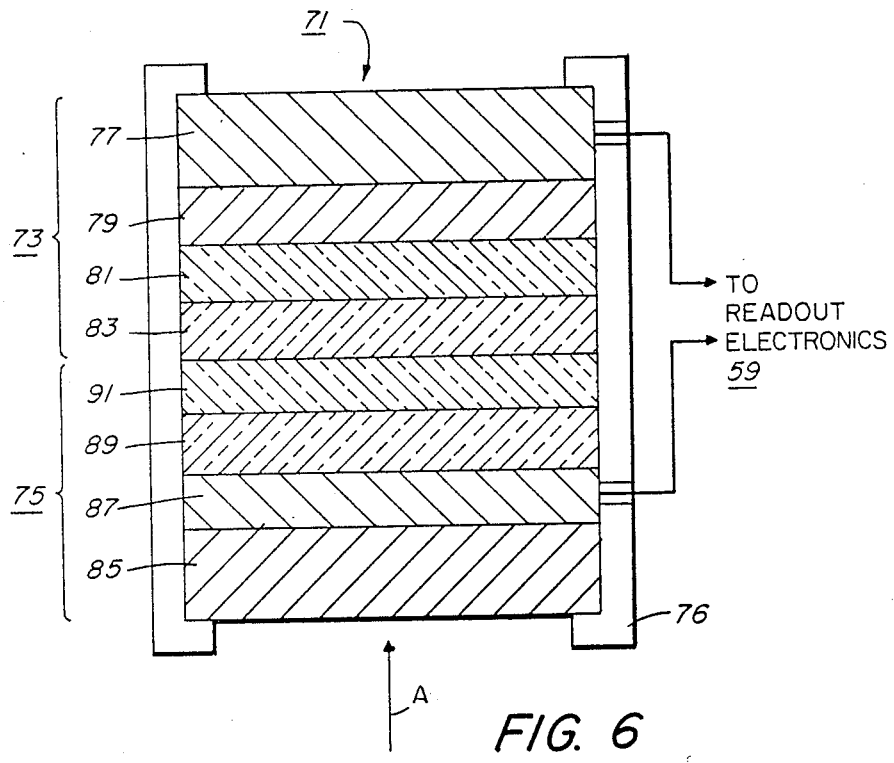
FIG. 6 is a cross-sectional view of another embodiment of a photoreceptor constructed according to this invention.

Referring now to FIG. 6, there is shown another embodiment of a photoreceptor constructed according to this invention and identified by reference numeral 71. In photoreceptor 71, the recording part of the device, i.e. The part containing the photoconductive insulator, and the readout part of the device, i.e. The part containing the semiconductor are constructed physically separate units. In addition, the substrate for the layers in the recording unit is made of conductive material and also serves as the reference electrode.

Photoreceptor 71 comprises a sensing or recording unit 73 and a readout unit 75. Sensing unit 73 and readout unit 75 are separate constructed units which are mechanically held together in close contact by a holder or frame 76 made of non-conductive material, such as a plastic.

Figure 7:
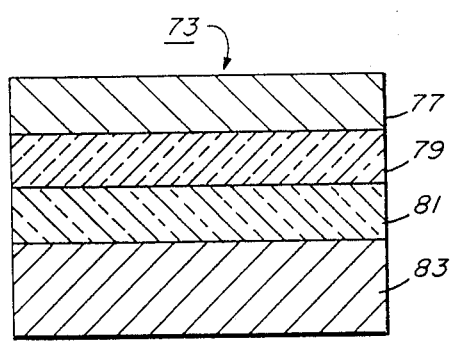
FIG. 7 is a cross-sectional view of the sensing unit in the photoreceptor shown in FIG. 6.

Sensing unit 73, which is also shown separately in FIG. 7, comprises a substrate 77 made of conductive material, such as aluminum or tungsten. A protective insulating layer 79 of a material, such as alumimum oxide, is deposited on the bottom surface of substrate 77. A layer 81 of a photoconductive insulating material, such as selenium, is deposited under insulating layer 79. Finally, a protective insulating layer 83 is deposited under layer 81. In addition to serving as a support for layers 79, 81 and 83, substrate 77 also functions as a reference electrode.

Figure 8:
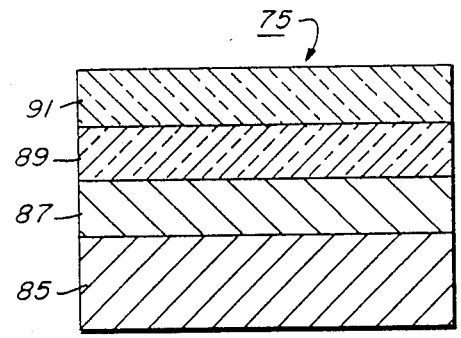
FIG. 8 is a cross-sectional view of another embodiment of the readout unit in the photoreceptor shown in FIG. 6.

Readout unit 75, which is shown separately in FIG. 8, includes a substrate 85 made of transparent material such as glass or a suitable plastic. A layer 87 of transparent conductive material is deposited on top of substrate 85. A layer 89 of semiconductor material which is conductive in the dark is deposited on top of layer 87 and a layer 91 of protective insulating material is deposited on top of layer 83. Examples of semiconductor material which may be used are crystalline or amorphorou hydrogenated silicon. Transparent substrate 85 and conductive layer 87 may be replaced by a substrate that is made of a material that is both transparent and conductive.

Figure 9:
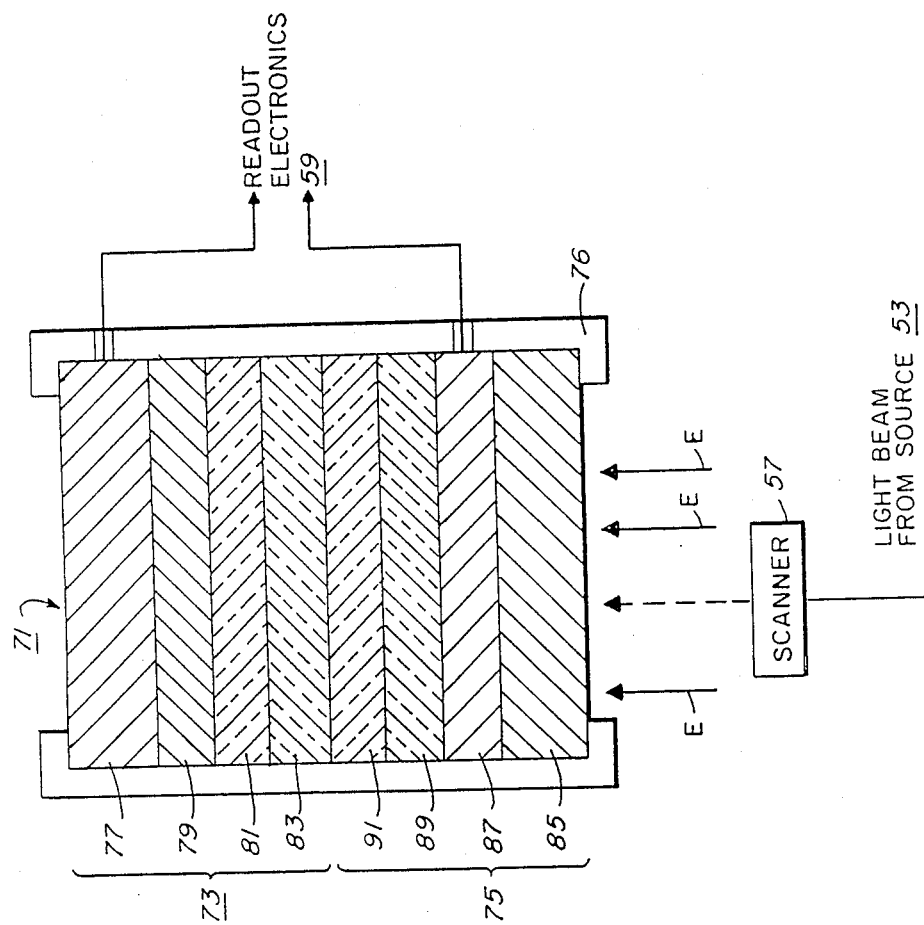
FIG. 9 is a view an embodiment of an apparatus for using the photoreceptor shown in FIG. 6.

Photoreceptor 71 may be used as shown in FIG. 9. Image forming radiation is applied to photoreceptor 71 from the bottom as shown by arrow E. The charge pattern so formed induces a surface depletion layer on semiconductor layer 89. The surface depletion layer is read out by scanning the semiconductor layer 89, also from the bottom with a modulated beam of light, such as from a helium-neon laser powered by a modulated power supply and then measuring the output voltage developed across conductive layer 87 and substrate 77.

The recording unit 73 may be removed, if desired, from frame 76 and be separate from readout unit 75 for exposure to the image forming radiation. If the recording is so removed, it must either be precharged prior to exposure or an additional electrode provided and a bias applied between the additional electrode and electrode 77 during exposure.

Instead of forming layers 87, 89 and 91, on substrate 85, the semiconductor may be in the form of a wafer, substrate 85 eliminated, layer 91 formed on top of the wafer and a conductive layer formed on the bottom of the wafer.

Instead of covering the entire top surface of substrate 85, layer 87 may extend over the top of substrate around the edge and be either nontransparent or transparent or even be in the form of a spot on the top substrate 85 and in contact with semiconductor layer 89. Layer 91 is preferably opaque to light of the wavelength used to provide the readout illumination so that the light will not strike and then discharge the charge pattern which may be formed on photoconductive insulating layer 87 by X-ray irradiation but is not opaque to the passage of light of a wavelength which may be used to intentionally erase the latent X-ray images on photoconducting insulating layer 81 (i.e. green, blue or UV light).

A doped layer may be formed under semiconductor layer 89 (i.e. between layers 87 and 89). If the semiconductor is a P type the doped layer is P+ and if the semiconductor is an N type the doped layer is N+.

Figure 10:
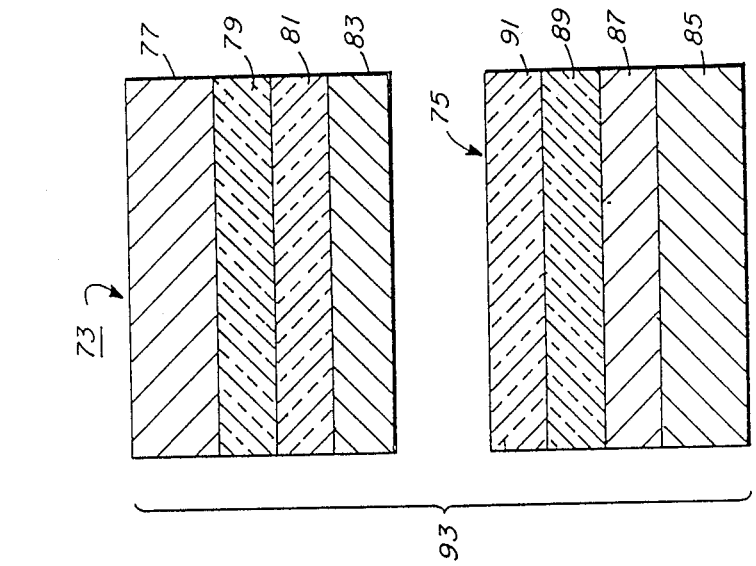
FIG. 10 is a view of another embodiment of a photoreceptor constructed according to this invention.

In FIG. 10 there is shown another embodiment of a photoreceptor, identified by reference numeral 93. Photoreceptor 93 includes a sensing unit 73 and a readout unit 75 as in photoreceptor 71; however, in this embodiment the two units are spaced apart rather than in close contact.

Figure 11:
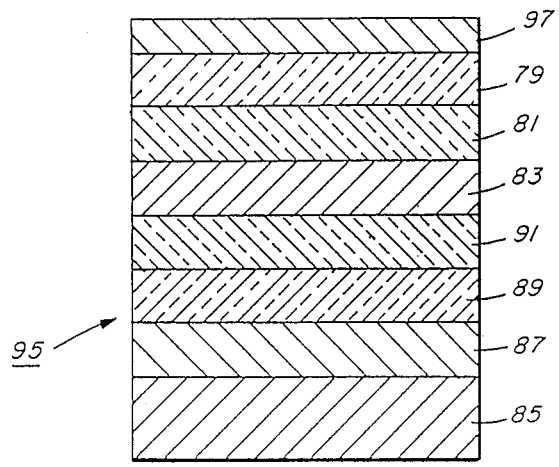
FIG. 11 is a view of another embodiment of a photoreceptor constructed according to this invention.

In FIG. 11 there is shown still another embodiment of a photoreceptor, identified by reference numeral 95. Photoreceptor 95 is similar to photoreceptor 71, the differences being that conductive substrate 77 is replaced with a conductive layer 97 and layers 97, 79, 81 and 83 are all layers deposited on top of layers 91.

It is apparent that the surface photovoltage signal that is available for amplification in the readout electronics in the apparatus is reduced by parasitic capacitance which forms a shunt path for the signal, potentiometrically reducing the signal that is actually amplified and detected. This shunt capacitance comes from elements internal and external to the readout unit. External elements include the connection from reference electrode and semiconductor contact (i.e. The conductive layer next to the semiconductor) to the amplifier in the readout electronics as well as the input capacitance of the amplifier itself. Internally, the capacitance between the inactive (unilluminated) area on the semiconductor and the reference electrode is parasitic and can be a large dominating factor seriously reducing the signal to noise ratio. In application where the ratio of illuminated to unilluminated pickup areas is small, means to limit the internal parasitic capacitance are important.

In FIGS. 12 through 20 a number of different photoreceptor and photoreceptor system arrangements are shown for reducing this parasitic capacitance.

Figure 12:
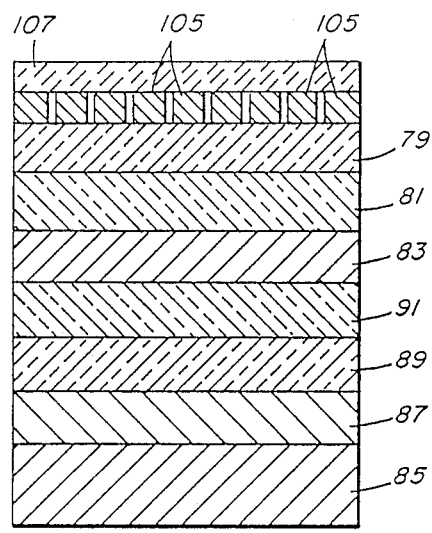
FIG. 12 is a cross-sectional view of another embodiment of a photoreceptor constructed according to this invention.
Figure 13:
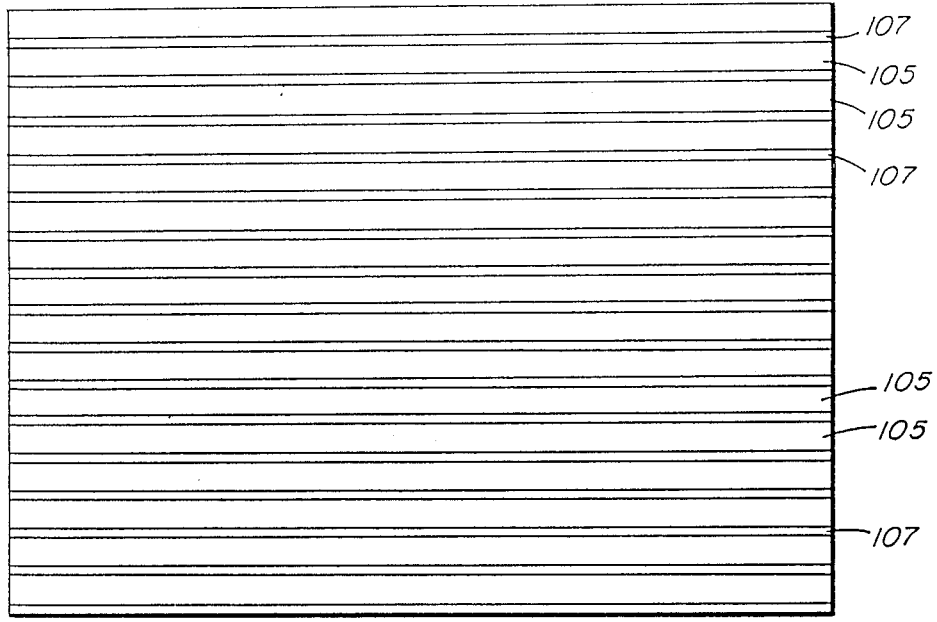
FIG. 13 is a plan view of the reference electrode in the photoreceptor shown in FIG. 12.

For example, in FIG. 12 there is shown a photoreceptor identified by reference numeral 101. Photoreceptor 101 differs from photoreceptor 71 shown in FIG. 6 in that the reference electrode 103 is not a single sheet as in reference electrode 77 in FIG. 6 but rather is in the form of a group of parallel unconnected conductive strips or segments 105 on a non-conductive substrate 107. A plan view of substrate 103 is shown in FIG. 13.

The array of segments 105 may be scanned with a single spot of light and appropriate switching arranged such that only one segment at a time is connected to the readout electronics. An arrangement for doing this is shown in FIG. 14.

Figure 14:
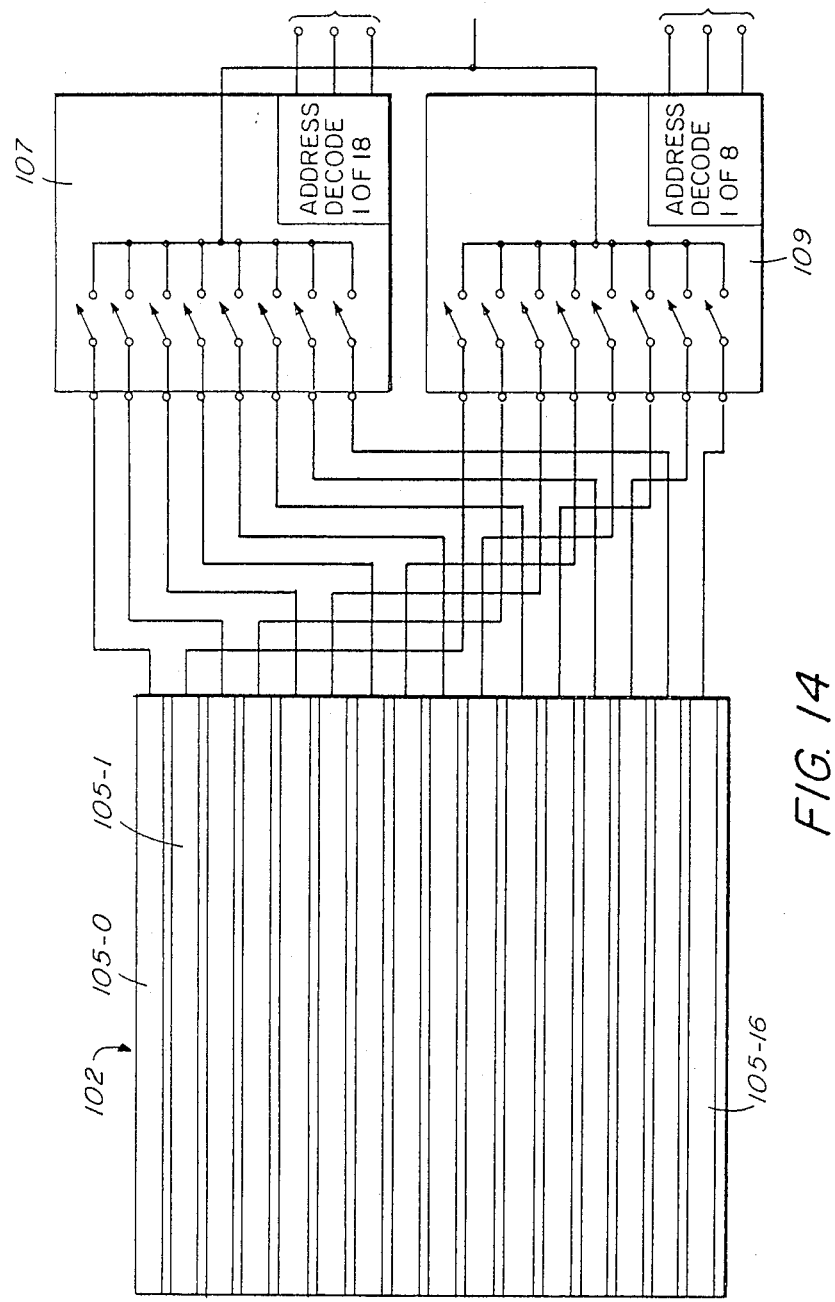
FIG. 14 is a schematic diagram showing how the segments in the reference electrode in FIG. 13 are connected to the readout electronics.

For illustrative purposes, in the arrangement shown in FIG. 14 reference electrode 102 is shown as having sixteen conductive strips 105 which are numbered 105-0 through 105-15. Strips 105 are connected to a pair of 8 channel C-MOS multiplexers 107 and 109, respectively, which are controlled by computer 63. Strips 105 are connected to multiplexers 108 and 109 in a way such that two consecutively numbered strips are always selected during a scan (i.e., electrically coupled to the readout electronics). Each strip is scanned (progressively) several times and during scanning of the second strip the connection to readout electronics 59 is shifted by one strip. For example, when strip 105-6 is being scanned strips 105-6 and 105-7 are connected to the readout electronics 59 and then when strip 105-7 is being scanned, strips 105-7 and 105-8 are connected to readout electronics 59. Multiplexer 108 and 109 may be Intensil model number IH6108.

By segmenting the reference electrode and electrically connecting it as shown, the active area on the reference electrode and as a result the parasitic capacitance is reduced.

Figure 15:
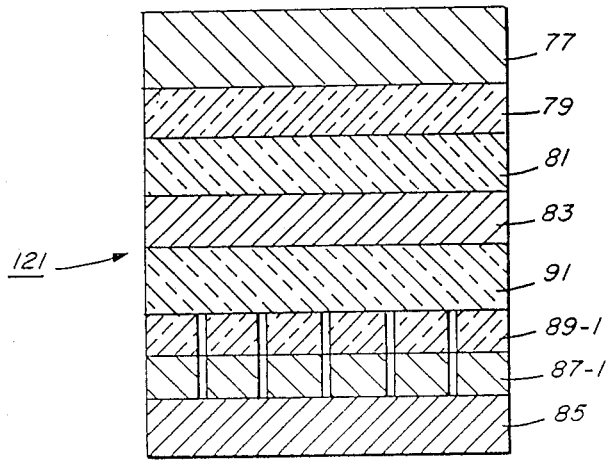
FIG. 15 is a cross-sectional view of another embodiment of a photoreceptor constructed according to this invention.
Figure 16:
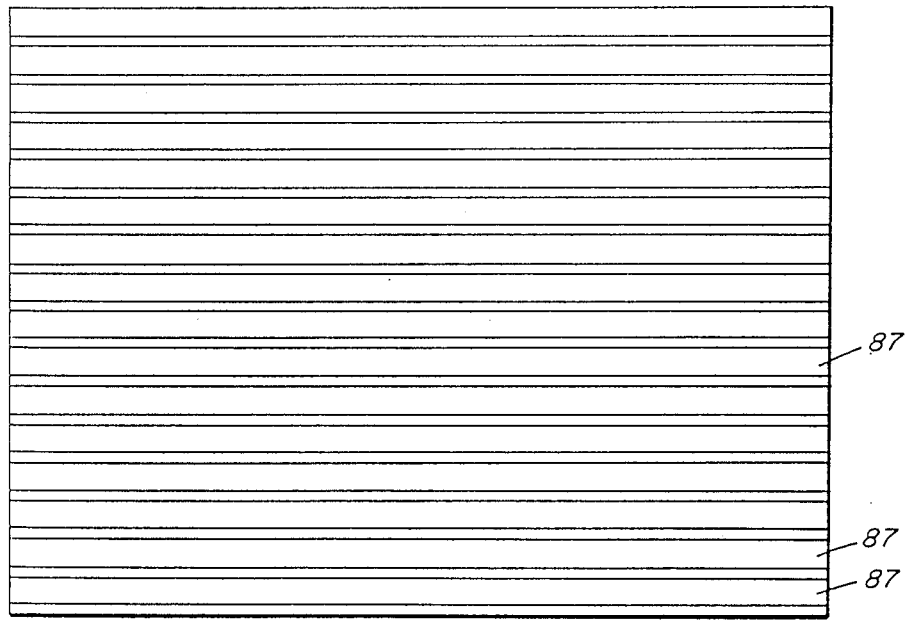
FIG. 16 is a plan view of the semiconductor layer, the conductive layer and supporting substrate shown in FIG. 15.

In FIG. 15, there is shown another embodiment of a photoreceptor constructed according to this invention for reduced parasitic capacitance and identified by reference numeral 121. Photoreceptor 121 differs from photoreceptor 71 shown in FIG. 6 in that the layer of semiconductor material and the layer of conductive material underneath the layer of semiconductor material instead of being continuous or uniform are each in the form of groups of parallel unconnected segment strips, the strips making up the semiconductor layer being identified by reference numerals 89-1 through 89-4 and the strips making up the conductive layer being identified by reference numerals 87-1 through 87-4. A plan view of this is shown in FIG. 16.

Photoreceptor 121 is connected to readout electronics using multiplexer arrangement such as shown in FIG. 14.

Figure 17:
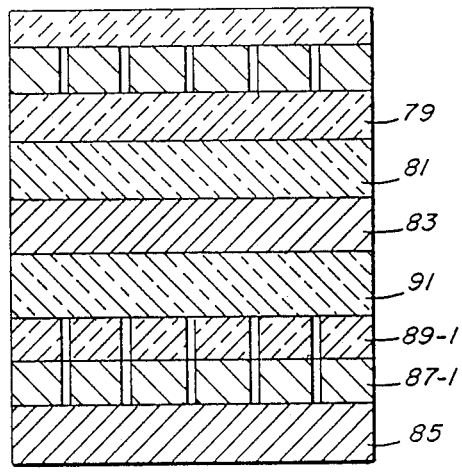
FIG. 17 is a cross-sectional view of another embodiment of a photoreceptor constructed according to this invention.

Referring now to FIG. 17 there is shown another embodiment of a photoreceptor constructed according to this invention for reduced parasitic capacitance, the photoreceptor being identified by reference numeral 131. As can be seen, photoreceptor 131 is essentially a combination of photoreceptors 101 and 121 with the reference electrode layer, the semiconductor layer and the conductive layer underneath the semiconductor layer all being segmented. In use, the reference electrode segments and the semiconductor and conductive layer segments are connected to the multiplexers such as shown in FIG. 14 such that a pair of reference electrode segments and the corresponding pairs of semiconductor and conductive segments are selected at the same time and the shift is made one strip at a time.

Figure 18:
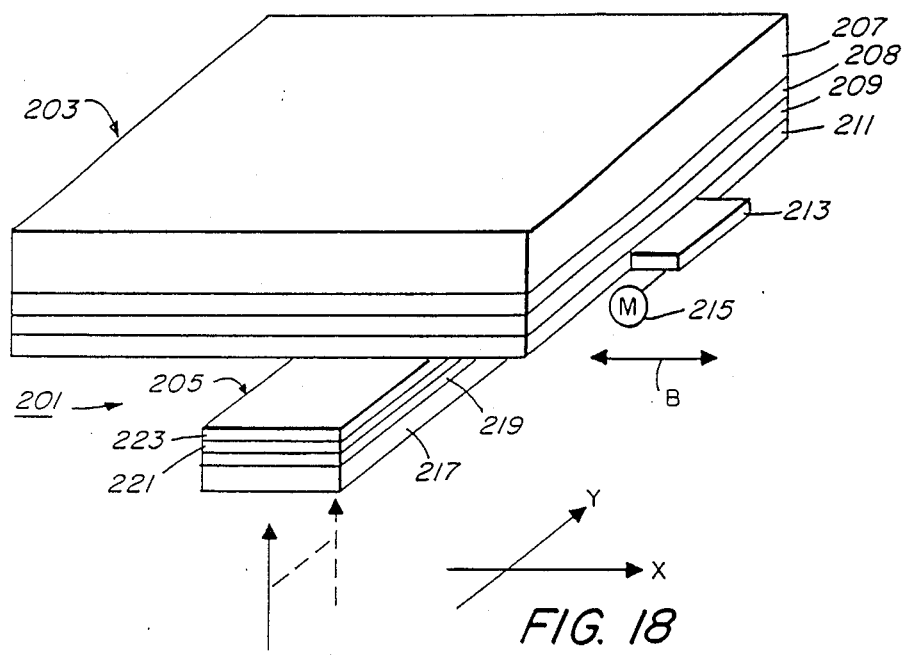
FIG. 18 is a cross-sectional view of a portion of another embodiment of the invention.

The parasitic capacitance can also be reduced by making the readout unit smaller than the recording unit and then moving it over the recording unit during readout. In FIG. 18 there is shown an example of an apparatus using this arrangement designed for reduced parasitic capacitance and identified by reference numeral 201. Apparatus 201 included a recording unit 203 and a readout unit 205.

Recording unit 203 includes a substrate 207 made of a conductive material such as aluminum, an insulating layer 208 which is optional, a layer 209 of a photoconductive insulating material such as selenium on the bottom of substrate 207 and a protective insulating layer 211 such as a polymer, under layer 209. Recording unit 203 is mounted on an assembly 213 which is movable by a motor 215 from left to right (in the "X" direction) as shown by arrows B.

Readout unit 205 includes a transparent substrate 217 such as glass, a conductive layer 219 on top of substrate 217, a layer 221 of semiconductor material conductive in the dark, such as silicon, and an insulating layer 223, such as silicon oxide on top of layer 221. Readout unit 205 is stationary. As can be seen, readout unit 205 is much smaller in size than recording unit 203.

Photoreceptor 204 is scanned with a modulated light beam that moves back and forth along the "Y" axis.

Figure 19:
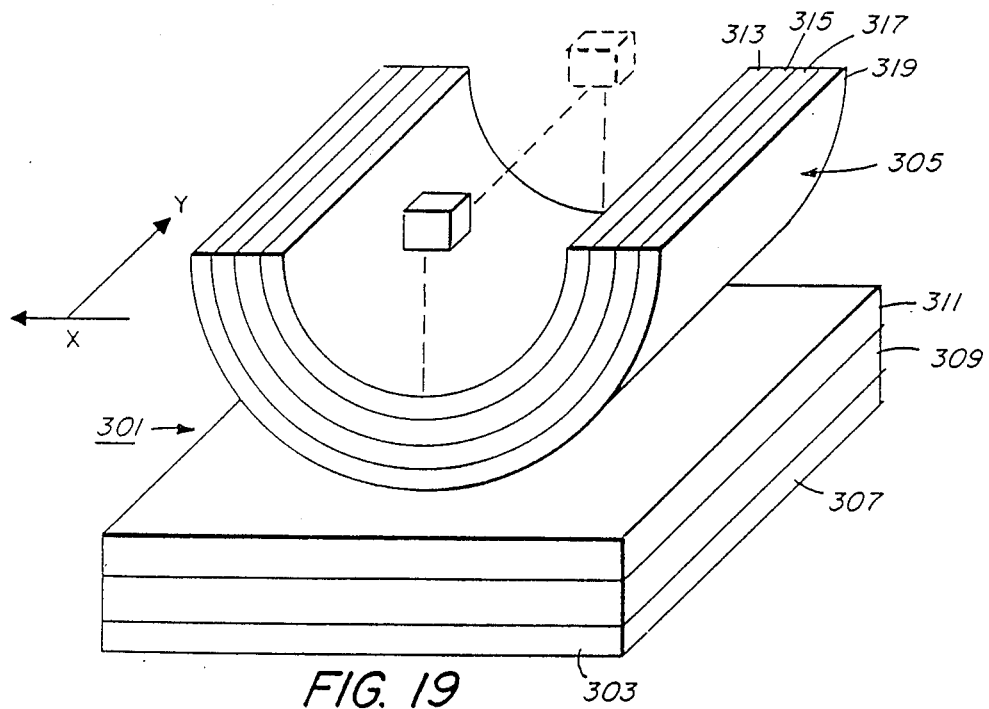
FIG. 19 is a cross-sectional view of a portion of another embodiment of the invention.

In FIG. 19 there is shown another embodiment of the invention designed specifically for reduced parasitic capacitance and identified by reference numeral 301. Apparatus 301 includes a recording unit 303 and a readout unit 305. Recording unit 303 is in the shape of a rectangular block or plate and includes a substrate 307 of conductive material, a layer 309 of photoconductive insulating material deposited on top of substrate 307 and an insulating layer 311 deposited on top of layer 309. Readout unit 305 is in the form of a portion of a cylinder and includes a nonconductive substrate 313, a layer 315 of conductive material on substrate 313, a layer 317 semiconductor material on top of layer 315 and an insulating layer 319 on top of layer 317.

Recording unit 303 is stationary. Readout unit 305 is mounted on an axle 319 that is movable by a motor (not shown) in the "X" direction so as to produce rolling movement of readout unit 305 over recording unit 303. The scanning light beam 321 scans in the "Y" direction. The source 323 of scanning light beam 321 moves from left to right with axle 319.

During the readout process readout cylinder portion 305 rolls back and forth (from left to right over recording unit 303) and the light spot is made to scan a focus (along the Y direction) that is constantly located at the contact line between recording unit 303 and readout unit 305. Since only a fraction of the two surfaces 311 and 319 are near the total mutual capactance is small.

Figure 20:
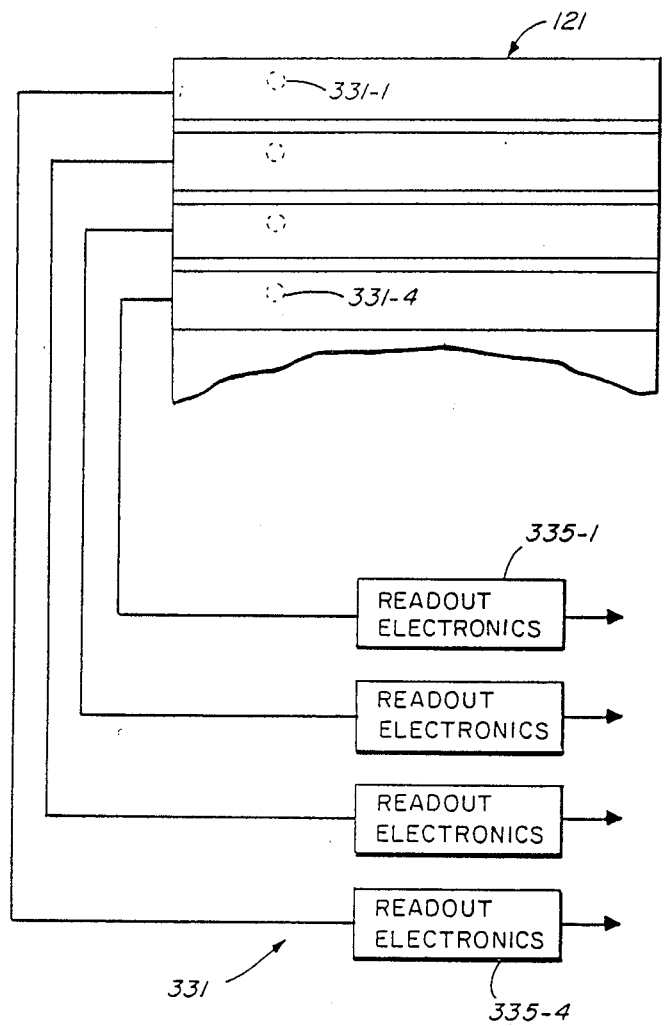
FIG. 20 is a schematic of a portion of another embodiment of the invention.

In FIG. 20 there is shown another embodiment of the invention identified by reference numeral 331. The apparatus includes a photoreceptor 121 having a segmented semiconductor and a segmented conductive layer, a plurality of scanning light beams 333-1 through 333-4, one for scanning each semiconductor segment and a plurality of signal detection channels 335-1 through 335-4, one for each semiconductor segment. In use the segments are scanned simultaneously outputs from the individual channels fed to the computer. This embodiment provides improved signal to noise ratio and data acquision time.

In accordance with this invention, the reference electrode should be positioned far enough from the latent charge image formed on the insulator such that a substantial portion of the charge is neutralized by the charge accumulated (induced) in the semiconductor depletion layer. However, if this is done, the capacative coupling between the semiconductor and the reference electrode will be low and the signal to noise ratio reduced. By reducing the distance between the reference electrode and the pickup electrode (the electrode in contact with the semiconductor) the signal to noise ratio will be increased.

Figure 21:
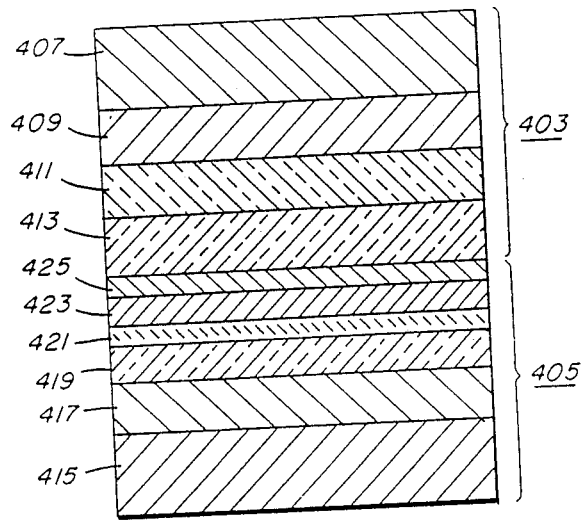
FIG. 21 is a cross-sectional view of another embodiment of a photoreceptor constructed according to this invention.

Referring now to FIG. 21, there is shown photoreceptor constructed according to this invention and identified by reference numeral 401 and wherein the distance between the reference electrode an the pickup electrode is accordingly reduced.

Photoreceptor 401 includes a recording or sensing unit 403 and a readout unit 405, sensing unit 403 being physically separate from readout unit 405.

Sensing unit 403 includes a substrate 407 made of conductive material. An insulating layer 409 is deposited on the bottom surface of substrate 407. A photoconductive insulating layer 411, such as selenium is deposited underneath layer 99 and a protective insulating layer 413 is deposited underneath layer 411. Layer 409 is optional, depending on the particular material used in layer 411.

Readout unit 405 includes a transparent substrate 415, such as glass or a suitable plastic, a conductive transparent layer 417 deposited on the top surface of substrate 415, a layer 419 of semiconductor material which is conductive in the dark deposited on top of layer 417, a first layer 421 of protective insulating material on top of layer 419, layer 421 also serving as a passivating layer, a layer 423 of conductive material in the shape of a grid deposited on top of layer 421 and a second layer 425 of protective insulating material on top of layer 423.

Layer 423 serves as the reference electrode.

Figure 22:
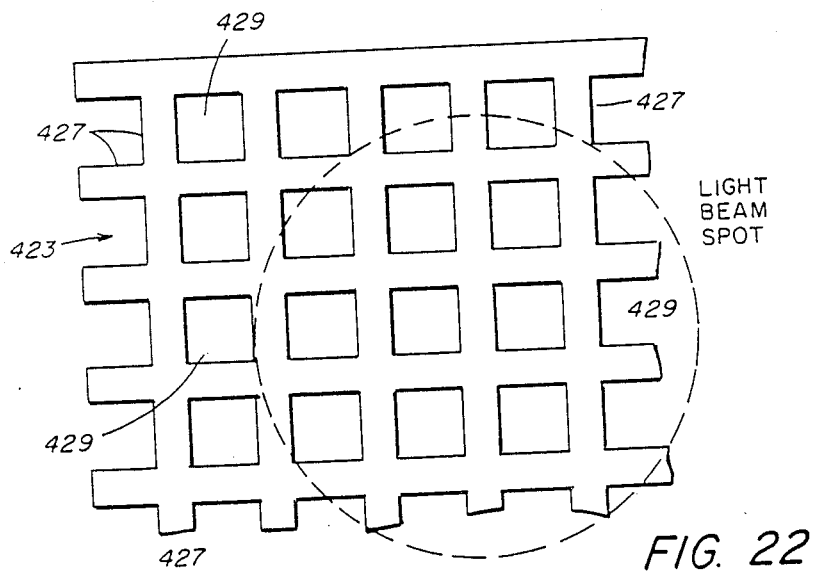
FIG. 22 is a plan view of the reference electrode in the photoreceptor shown in FIG. 21.

A plan view of grid layer 423 is shown in FIG. 22. As can be seen, grid layer 423 is made of a pattern of conductive strips 427 and open spaces 429. As can also be seen, the grid spaces 429 are small relative to the size of the light spot that scans over the readout unit 405 but is sized to allow a significant portion of the electric field induced by the latent charge image to pass through and terminate at the top surface of semiconductor layer 419 so as to influence the width of the depletion region.

Grid layer 423 may be fabricated by thin film photolithography methods common in semiconductor manufacturing practice or any other suitable technique.

Figure 23:
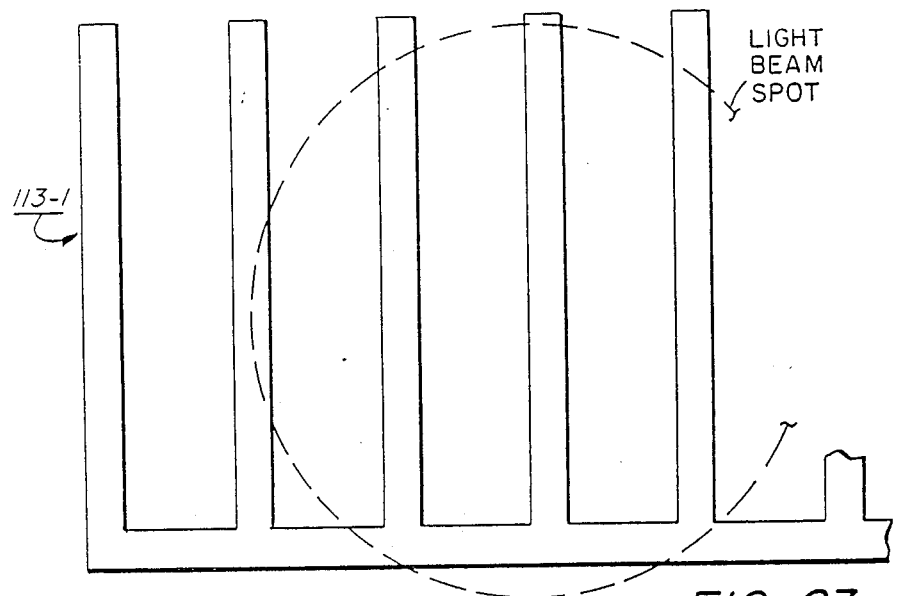
FIG. 23 is a plan view of a modification of the reference electrode shown in FIG. 22.
Figure 24:
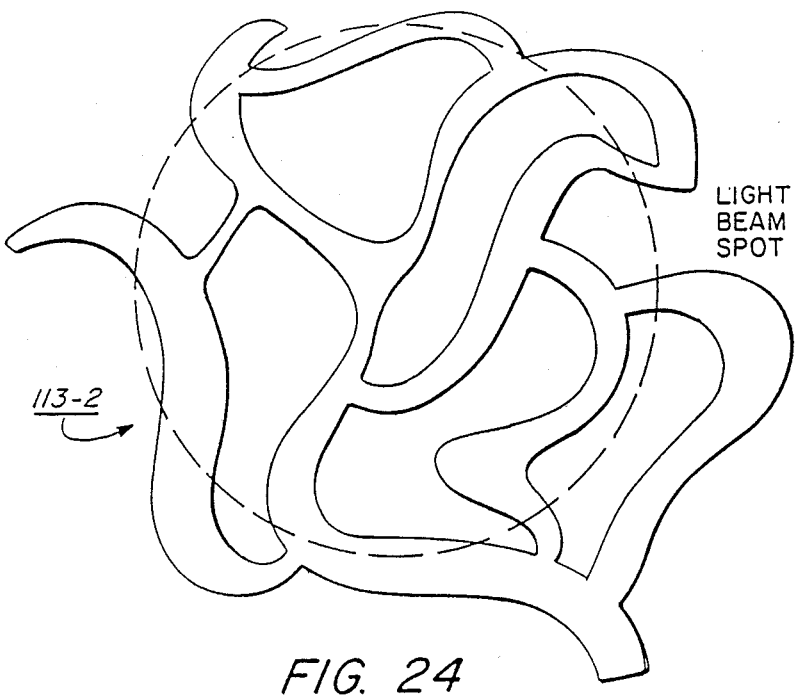
FIG. 24 is a plan view of another modification of the reference electrode shown in FIG. 23.

In FIG. 21, the grid 113 is in the form of a square pattern. However, this is only by way of example. The grid need not be square shaped and, in fact, need not even be a pattern of regular shape. An example of a non-square shaped pattern identified by reference numeral 113-1 is shown in FIG. 23 and an irregularly shaped pattern identified by reference numeral 113-2 is shown in FIG. 24.

Providing a device in which the reference electrode is between the photoconductive insulator and the semiconductor rather than in back of the semiconductor improves the signal to noise ratio, enables segmenting the readout unit in a very efficient manner, enables applying a bias field to the semiconductor surface and enables signal coupling without using the substrate of the charge bearing surface.

Figure 25:
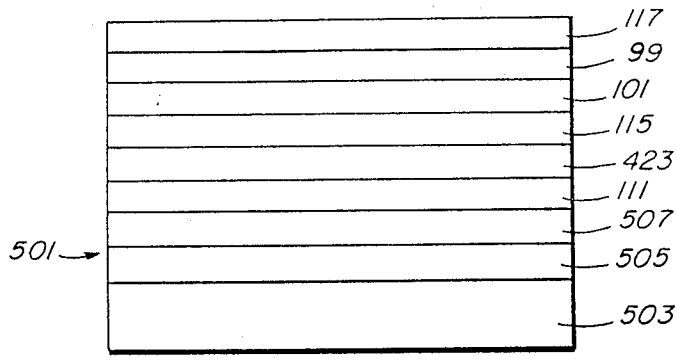
FIG. 25 is a cross-sectional view of another embodiment of a photoreceptor constructed according to the teachings of this invention.

In FIG. 25 there is shown another photoreceptor identified by reference numeral 501. Photoreceptor 501 includes a transparent substrate 503, a conductive transparent layer 505 deposited on substrate 503, a semiconductor layer 507 deposited on layer 505, a protective insulating layer 111 deposited on layer 109, a reference electrode grid layer 423 deposited on layer 111, a protective insulating layer 115 deposited on layer 423, a photoconductive-insulating layer 101 deposited on layer 115 a protective insulating layer 99 deposited on layer 101 and a layer of conductive material 117 deposited on layer 99. Alternatively, layer 117 could be a substrate and layer 503 omitted.

Figure 26:
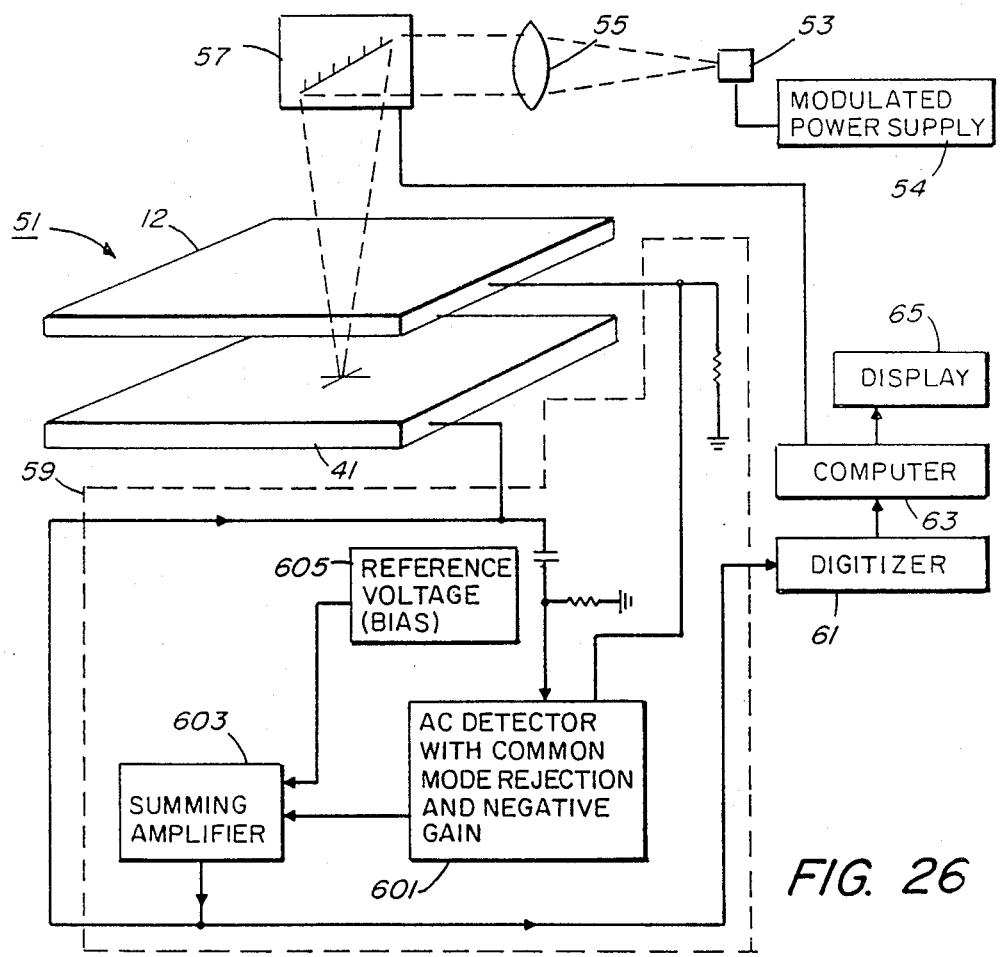
FIG. 26 is a schematic of the invention illustrating the details of an embodiment of the readout electronics.

In FIG. 26 there is shown a more detailed block diagram of readout electronics 59. The circuitry includes an AC detector 601 with common mode rejection and negative gain which detects the AC photovoltage signal between the reference electrode 12 and the photoreceptor 41. The output of AC detection 601 is fed into a summing amplifier 603 along with a bias reference signal from a source 605. The output of summing amplifier 603 is the output signal of readout electronics 59. The output signal is also applied as a feed back signal to AC detector 601. Also shown in the circuit is a capacitor 607 and a pair of resistors 609 and 611.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A photoreceptor for use in recording and reading out a charge distribution pattern comprising:
   a. a reference electrode,
   b. a photoconductive insulator, and
   c. a semiconductor/pickup electrode combination, and
   d. wherein either said reference electrode or said semiconductor pickup electrode combination or both of said reference electrode and said semiconductor/pickup electrode are segmented.

2. Apparatus for use in recording and reading out a charge distribution pattern comprising:
   a. a recording unit for recording said charge distribution pattern, said recording unit including reference electrode and a photoconductive insulator,
   b. a readout unit for use in reading out the charge distribution pattern, said readout unit including a semiconductor/pickup electrode combination said readout unit being sized smaller than said recording unit and being movable relative to said recording unit, and
   c. light beam means for scanning said readout unit.

3. The apparatus of claim 2 and further including means for moving said recording unit relative to said readout unit.

4. The apparatus of claim 2 and wherein said recording unit is stationary and said readout unit is movable relative to said recording unit.

5. The apparatus of claim 2 and wherein said recording unit is in the shape of a block or plate and the readout unit is in the shape of a portion of a cylinder.

6. The apparatus of claim 2 and wherein said readout unit is rotationally and translationally movable relative to said recording unit.

7. A photoreceptor for use in recording and reading out a charge distribution pattern comprising:
   a. a recording unit for recording said charge distribution pattern, said recording unit including a segmented reference electrode and a photoconductive insulator, and
   b. a readout unit for use in reading out the charge distribution pattern, said readout unit including a semiconductor/pickup electrode combination.

8. The photoreceptor of claim 7 and wherein said recording unit and said readout unit are separately constructed units.

9. The photoreceptor of claim 8 and wherein the segmented reference electrode comprises a plurality of parallel unconnected conductive strips.

10. A photoreceptor for use in recording and reading out a charge distribution pattern comprising:
    a. a recording unit for recording said charge distribution pattern, said recording unit including:
       i. a non-conductive substrate,
       ii. a segmented reference electrode on said non-conductive substrate,
       iii. a protective insulating layer on said segmented reference electrode, and
       iv. a photoconductive insulating layer on said protective insulating layer,
    b. a readout unit for use in reading out the charge distribution pattern, said readout unit including a semiconductor/pickup electrode combination.

11. A photoreceptor for use in recording and reading out a charge distribution pattern comprising:

a. a recording unit of recording said charge distribution pattern, said recording unit including reference electrode and a photoconductive insulator, b. a readout unit for use in reading out the charge distribution pattern, said readout unit including a segmented semiconductor and a segmented pickup electrode.

12. The photoreceptor of claim 11 and wherein said reference electrode in said recording unit is segmented.

13. A photoreceptor for use in recording and reading out a change distribution pattern comprising:

a. a first nonconductive substrate, b. a segmented reference electrode on said first nonconductive substrate, c. a protective insulating layer on said segmented reference electrode, d. a photoconductive insulative layer on said protective insulating layer, e. a second nonconductive substrate, f. a pickup electrode on said second nonconductive substrate, g. a semiconductor layer on said pickup electrode, and h. a protective insulating layer on said semiconductor layer.

* * * * *